US010319950B2

United States Patent
Kuang

(10) Patent No.: US 10,319,950 B2
(45) Date of Patent: Jun. 11, 2019

(54) EVAPORATION METHOD AND EVAPORATION DEVICE FOR ORGANIC LIGHT-EMITTING DIODE SUBSTRATE

(71) Applicant: Shenzhen China Star Optoelectronics Technology Co., Ltd., Shenzhen (CN)

(72) Inventor: Youyuan Kuang, Shenzhen (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 14/907,885

(22) PCT Filed: Jan. 6, 2016

(86) PCT No.: PCT/CN2016/070272
§ 371 (c)(1),
(2) Date: Oct. 19, 2017

(87) PCT Pub. No.: WO2017/101174
PCT Pub. Date: Jun. 22, 2017

(65) Prior Publication Data
US 2018/0034005 A1    Feb. 1, 2018

(30) Foreign Application Priority Data
Dec. 15, 2015  (CN) .......................... 2015 1 0932728

(51) Int. Cl.
| | | |
|---|---|---|
| H01L 51/56 | (2006.01) | |
| C23C 14/24 | (2006.01) | |
| C23C 14/50 | (2006.01) | |
| C23C 14/54 | (2006.01) | |
| H01L 51/00 | (2006.01) | |

(52) U.S. Cl.
CPC .............. *H01L 51/56* (2013.01); *C23C 14/24* (2013.01); *C23C 14/243* (2013.01); *C23C 14/50* (2013.01);
(Continued)

(58) Field of Classification Search
CPC ..... H01L 51/56; C23C 14/542; C23C 14/545; C23C 14/54
See application file for complete search history.

(56) References Cited

U.S. PATENT DOCUMENTS

2005/0016462 A1* 1/2005 Yamazaki ............... C23C 14/12
118/726
2008/0295308 A1 12/2008 Wijngaards et al.
(Continued)

FOREIGN PATENT DOCUMENTS

| CN | 101565813 A | 10/2009 |
|---|---|---|
| CN | 102453872 A | 5/2012 |

(Continued)

OTHER PUBLICATIONS

Xu, et al., "Theories and Technologies on Surface Engineering," National Defense Industry Press, Beijing, Ed. 2, Apr. 30, 2010, pp. 217-219. (5 pages).
(Continued)

*Primary Examiner* — Selim U Ahmed
*Assistant Examiner* — Evan G Clinton
(74) *Attorney, Agent, or Firm* — Andrew C. Cheng

(57) ABSTRACT

An evaporation method and an evaporation device for an organic light-emitting diode substrate are proposed. The evaporation method includes: step 1, regulating a distance between a supporting module for supporting a substrate and a crucible platform of an evaporation device; step 2, adjusting a direction of opening of a crucible disposed on the crucible platform; and step 3, placing a substrate to be evaporated on the supporting module and volatizing an evaporation source in the crucible and attaching the volatized evaporation source onto a surface of the substrate.

16 Claims, 3 Drawing Sheets

(52) U.S. Cl.
CPC ............ *C23C 14/54* (2013.01); *C23C 14/542* (2013.01); *C23C 14/545* (2013.01); *H01L 51/001* (2013.01); *H01L 51/0031* (2013.01); *H01L 2251/558* (2013.01)

(56) References Cited

U.S. PATENT DOCUMENTS

| | | | |
|---|---|---|---|
| 2009/0108739 A1* | 4/2009 | Shimizu | H01L 27/3211 313/504 |
| 2012/0107504 A1 | 5/2012 | Maurer et al. | |
| 2013/0337174 A1 | 12/2013 | Goebert et al. | |
| 2014/0014032 A1 | 1/2014 | Gross et al. | |
| 2014/0099740 A1 | 4/2014 | Lee | |
| 2014/0106482 A1 | 4/2014 | Lee | |
| 2017/0152597 A1 | 6/2017 | Ma et al. | |
| 2017/0268096 A1* | 9/2017 | Huang | C23C 14/243 |

FOREIGN PATENT DOCUMENTS

| | | |
|---|---|---|
| CN | 103261468 A | 8/2013 |
| CN | 103710682 A | 4/2014 |
| CN | 103726017 A | 4/2014 |
| CN | 103938161 A | 7/2014 |
| JP | 2008-140669 A | 6/2008 |
| JP | 2008-296582 A | 12/2008 |

OTHER PUBLICATIONS

Ni, et al., "Inorganic and Analytical Chemistry", Chemical Industry Press, Beijing, Jun. 30, 1998, pp. 17-18. (5 pages).

Second Office Action dated Jan. 3, 2017, by the State Intellectual Property Office of People's Republic of China in corresponding Chinese Patent Application No. 201510932728.2, and an English translation of the Office Action. (19 pages).

Office Action dated Jun. 16, 2017, by the State Intellectual Property Office of People's Republic of China in corresponding Chinese Patent Application No. 201510932728.2. (8 pages).

Notification of Transmittal of the International Search Report and the Written Opinion of the International Searching Authority (Forms PCT/ISA/220, PCT/ISA/210, and PCT/ISA/237) dated Sep. 12, 2016, by the State Intellectual Property Office of People's Republic of China in corresponding International Application No. PCT/CN2016/070272. (12 pages).

* cited by examiner

Prior Art

EVAPORATION METHOD AND EVAPORATION DEVICE FOR ORGANIC LIGHT-EMITTING DIODE SUBSTRATE

CROSS-REFERENCE TO RELATED APPLICATIONS

The present application claims the priority of Chinese patent application CN201510932728.2, entitled "Evaporation method and evaporation device for organic light-emitting diode substrate" and filed on Dec. 15, 2015, the entirety of which is incorporated herein by reference.

FIELD OF THE INVENTION

The present disclosure relates to the technical field of display, and in particular, to an evaporation method and an evaporation device for organic light-emitting diode substrate.

BACKGROUND OF THE INVENTION

In recent years, organic light-emitting diode (hereinafter referred to as OLED) has made rapid advancement as a new generation solid auto luminescence display technology. As compared with liquid crystal display devices, an organic light-emitting diode is superior with its ultra-thinness, high responsiveness, high contrast ratio and low power dissipation. At present, in the production process of OLED, an OLED substrate is usually made through an evaporation method. That is to say, organic small molecular material is heated inside a vacuum cavity till being sublimated or melted and gasified into material vapor, which seeps through pores in a metal photomask and sediments on a glass substrate.

In the production process of OLED substrate, doping of different materials has been extensively adopted. The homogeneity of the materials doping directly affects indicators of the OLED device, such as the luminous efficiency and brightness.

In the prior art, different proximities between evaporation sources are adopted in the production process of the OLED, so that the homogeneity of doping can be improved. For example, as shown in FIG. 5, an evaporation device 50 comprises a crucible platform 53 and a crucible 52 disposed on the crucible platform 53. In the evaporating process, two crucibles 52 approximate with each other, so as to form a mixed film layer 54 on a substrate 51. Although such method can improve the homogeneity of doping among various evaporation materials to some extent, it can also cause a homogeneity of thickness of the film formed on the glass substrate to decrease, i.e., the film layer sedimenting on the glass substrate has inconsistent thickness over different positions thereof. As a result, the OLED device produced through this method has limited luminous efficiency and limited brightness.

In this case, an evaporation method and an evaporation device for the organic light-emitting diode substrate that can improve the luminous performance of the OLED device can be improved.

SUMMARY OF THE INVENTION

Directed against the above problems, an evaporation method and an evaporation device for organic light-emitting diode substrate are provided according to the present disclosure. The evaporation method for the organic light-emitting diode substrate enables a film layer formed on the substrate to be more homogeneous, thereby improving the luminous effect of an organic light-emitting diode display device with such substrate. In the meantime, the evaporation device has simple structure, thereby facilitating the homogeneity of a film layer formed on the substrate.

In a first aspect according to the present disclosure, an evaporation method for organic light-emitting diode substrate is provided, comprising the following steps. In step 1, a distance between a supporting module for supporting a substrate and a crucible platform of an evaporation device is regulated; in step 2, a direction of opening of a crucible disposed on the crucible platform is adjusted; and in step 3, the substrate to be evaporated is placed on the supporting module, and an evaporation source in the crucible is volatized and the volatized evaporation source is attached onto a surface of the substrate.

In an embodiment according to the present disclosure, in step 1, the evaporation source is selected and volatized, so as to form a single film layer on a corresponding first test substrate; different first test points are selected on the first test substrate, so as to obtain a thickness value of the single film layer at each of the first test points; a ratio of a difference between a maximum value and a minimum value of the thickness values of the single film layer at the first test points on the first test substrate to a sum thereof is calculated to obtain a test single film layer thickness homogeneity parameter; and a comparison of the test single film layer thickness homogeneity parameter with a standard single film layer thickness homogeneity parameter is made, so as to adjust the distance between the supporting module and the crucible platform.

In an embodiment according to the present disclosure, the standard single film layer thickness homogeneity parameter is in a range of 1% to 3%; and when the test single film layer thickness homogeneity parameter is smaller than 1%, the distance between the supporting module and the crucible platform is reduced, and when the test single film layer thickness homogeneity parameter is larger than 3%, the distance between the supporting module and the crucible platform is increased.

In an embodiment, 12-24 of the first test points are selected on the first test substrate.

In an embodiment, when the first test substrate is square shaped, the first test points are evenly distributed along a diagonal line.

In an embodiment, in step 2, the direction of opening of each of the crucibles is coarsely adjusted, so that the evaporation source in each of the crucibles volatilizes either outwardly and obliquely in a homogeneous manner, or inwardly and obliquely in a homogeneous manner.

In an embodiment, an angle formed between a straight line of volatilization of the evaporation source in the crucible and a plane in which the crucible platform is located is in a range of 10-80 degrees.

In an embodiment, in step 2, each evaporation is volatized, so that a mixed film layer is formed on a second test substrate, different second test points are selected on the second test substrate, so as to obtain a thickness value of the mixed film layer at each of the second test points; a ratio of a difference between a maximum value and a minimum value of the thickness values of the mixed film layer to an average value thereof is calculated to obtain a test mixed film layer thickness homogeneity parameter; and when the test mixed film layer thickness homogeneity parameter is smaller than a standard mixed film layer thickness homogeneity parameter, the direction of each of the crucibles is fixed.

According to another aspect of the present disclosure, an evaporation device for implementing an evaporation method is proposed, comprising a supporting module for supporting the substrate, a crucible platform disposed under the supporting module, the crucible being disposed on the crucible platform, an evaporation source disposed in the crucible, and a driving module for driving the crucible to rotate, the driving module comprising a driving shaft fixedly connected with the crucible and a driving source connected with the driving shaft.

In an embodiment, a thermal insulation member is disposed between the driving shaft and the crucible.

As compared with the prior art, the present disclosure has the following advantages. By adjusting the distance between the supporting module for supporting the substrate and the crucible platform, the homogeneity of the film layer formed on the substrate can be guaranteed, so that the display performance of the OLED device can be improved accordingly. In the meantime, by regulating the direction of opening of the crucible, the homogeneity of the organic material in each of the evaporation source that is mixed in the substrate can be guaranteed, so that the luminous effect of the OLED device can be enhanced. In addition, the evaporation method is easy to implement.

BRIEF DESCRIPTION OF THE DRAWINGS

For further illustrating the technical solutions provided in the embodiments of the present disclosure, a brief introduction will be given below to the accompanying drawings involved in the embodiments. In the drawings.

Figure 1:
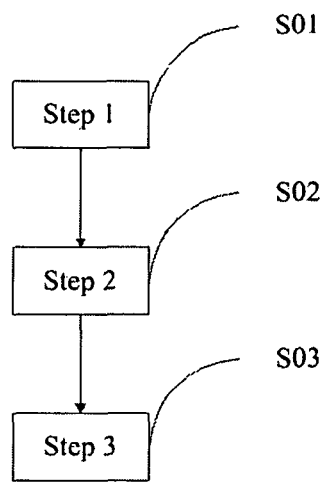
FIG. 1 shows a flow diagram of an evaporation method according to the present disclosure.

In the drawings, the same components are indicated with the same reference sign. The drawings are not drawn to actual scale.

DETAILED DESCRIPTION OF THE EMBODIMENTS

The present disclosure will be further described in view of the accompanying drawings.

Figure 2:
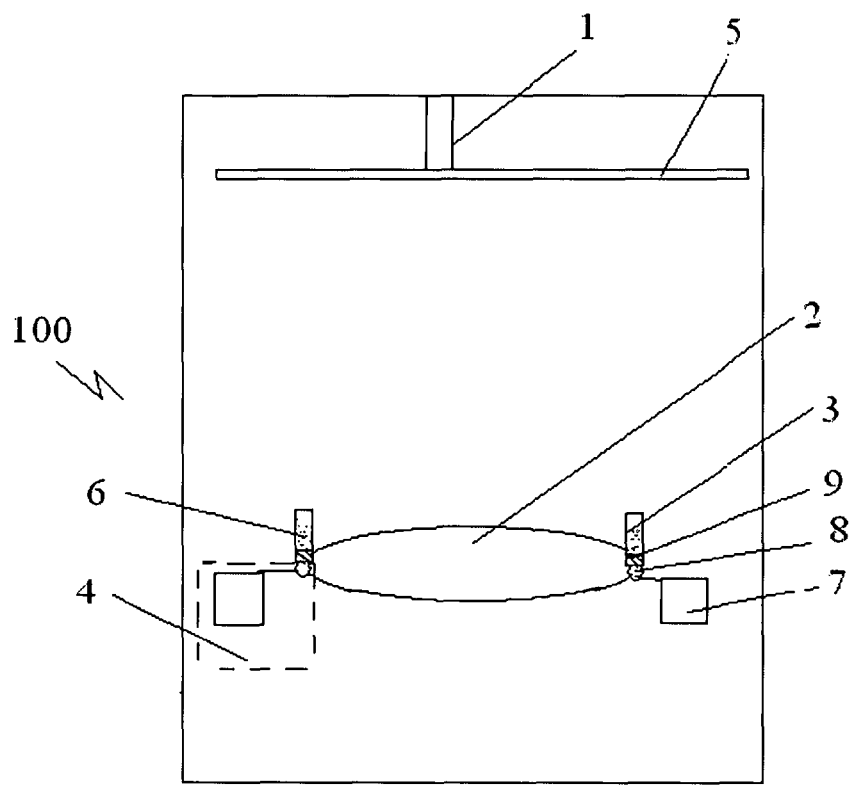
FIG. 2 schematically shows an evaporation device according to an example of the present disclosure.

FIG. 2 schematically shows an evaporation device 100 according to an embodiment of the present disclosure. As shown in FIG. 2, the evaporation device 100 comprises a supporting module 1, a crucible platform 2, a crucible 3 disposed on the crucible platform 2, and a driving module 4. The supporting module 1 is used for supporting a substrate 5 in an evaporation process. The crucible platform 2 is disposed under the supporting module 1 for emplacing the crucible 3. The crucible 3 is used for holding evaporation sources 6, which is organic molecular material that can sediment on the substrate 5. As the crucible 3 is heated, the evaporation sources 6 can volatize and form a film layer on the substrate 5. The driving module 4 is used for driving a movement of the crucible 3, so that a thickness of the film layer formed on the substrate 5 can be regulated. In addition, the driving module 4 comprises a driving source 7 and a driving shaft 8. An end of the driving shaft 8 is connected with the driving source 7, so as to move with the driving source 7; and another end of the driving shaft 8 is connected with the crucible 3, so that a direction of opening of the crucible 3 can be adjusted.

In this case, an adjustability of the direction of opening of the crucible 3 can be realized through the evaporation device 100, thereby facilitating improving homogeneity of the film layer sedimented on the substrate 5. As a result, a luminous efficiency of an OLED device with the substrate 5 produced through the evaporation device 100 can be guaranteed.

In order to ensure safe operation of the evaporation device 100, a thermal insulation member 9 is disposed between a driving shaft 8 and the crucible 3. Preferably, the thermal insulation member 9 can be a micro/nano insulation plate. By arranging the thermal insulation member 9, excessive heat from the crucible 3 can be avoided from transferring to the driving shaft 8, thereby avoiding affecting an evaporation temperature of the evaporation source 6. In the meantime, by arranging the thermal insulation member 9, the driving shaft 8 can avoid from getting more heat, so as not to affect normal operation of the driving shaft 8.

It should be noted that the evaporation device 100 further comprises some other structures and members, which are well known to the person skilled in the art, and thus will not be described in detail herein.

FIG. 1 shows a method of evaporating on the substrate 5 through the evaporation device 100. The evaporation method for an OLED display substrate 5 will be described in detail in view of FIGS. 1-4.

As shown in FIG. 1, S01, i.e., step 1, is performed. In step 1, a distance between the supporting module 1 and the crucible platform 2 is regulated, so as to guarantee homogeneity of a film layer formed on the substrate 5 by sedimentation of organic molecular material from the evaporation sources 6 thereon. Next, S02, i.e., step 2 is performed. In step 2, a direction of opening of the crucible 3 disposed on the crucible platform 2 is adjusted, so as to regulate the homogeneity of a mixture of different organic molecular materials sedimented on the substrate 5. Finally, S03, i.e., step 3 is performed. In step 3, the substrate 5 to be evaporated is placed on the supporting module 1, the evaporation source 6 in the crucible 3 is volatized, and the volatized evaporation source 6 is attached onto a surface of the substrate 5, so as to process the substrate 5.

Specifically, in step 1, an evaporation source 6 is selected to volatize the organic molecular material, so as to form a single film layer on a corresponding test substrate 5'. Different first test points 10' are selected on the first test substrate, so as to obtain a thickness value of the single film layer at each of the first test points 10'; a ratio of a difference between a maximum value and a minimum value of the thickness values of the single film layer at the first test points 10' on the first test substrate to a sum therebetween is calculated to obtain a test single film layer thickness homogeneity parameter; and a comparison of the test single film layer thickness homogeneity parameter with a standard single film layer thickness homogeneity parameter is made, so as to adjust the distance between the supporting module 1 and the crucible platform 2.

Preferably, the standard single film layer thickness homogeneity parameter is in a range of 1% to 3%; and when the test single film layer thickness homogeneity parameter is smaller than 1%, the distance between the supporting module 1 and the crucible platform 2 is reduced, and when the test single film layer thickness homogeneity parameter is larger than 3%, the distance between the supporting module 1 and the crucible platform 2 is increased. Such configuration can make sure that the organic molecular material in different evaporation sources 6 volatizes onto the substrate 5 homogeneously, and in the meantime prevent the distance between the supporting module 1 and the crucible platform 2 from being too large to cause over large volume of the evaporation device 100.

In a preferred embodiment, 12-24 of the first test points 10' are selected on the first test substrate 5'. Further preferably, when the first test substrate 5' is square shaped, the first test points 10' are evenly distributed along a diagonal line. Such configuration can guarantee not only a precision of a test method but also an efficiency of the test.

Figure 3:
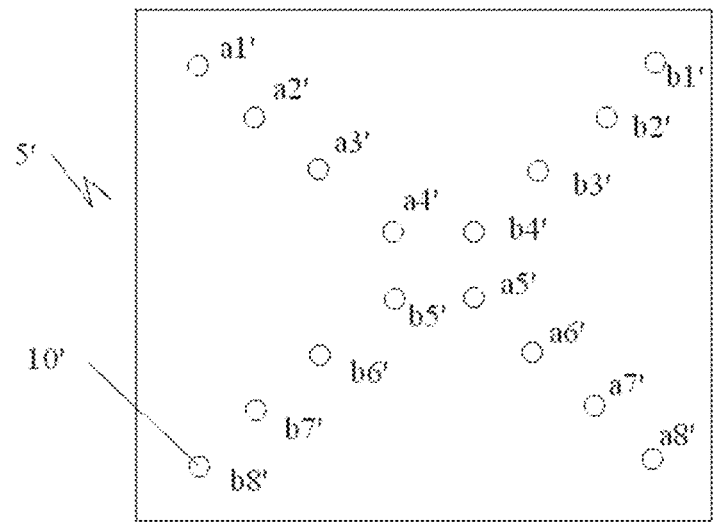
FIG. 3 shows a distribution map of first test points on a first test substrate.

In the evaporation method, specific operation of the distance between the supporting module 1 and the crucible platform 2 are illustrated with the demand of two organic molecular materials as an example. For example, two evaporation sources 6, including evaporation source 6A and evaporation source 6B are used. First, a first test substrate 5' is selected and put on an evaporation device 100. Only the evaporation source CA is heated, so as to form a single film layer on the first test substrate 5'. At this moment, an opening of a crucible 3 is facing right upward. 8 first test points 10' are selected along each of two diagonal lines of the first test substrate 5', respectively a1', a2', ... a8'; and b1', b2', ... b8', as shown in FIG. 3. Thicknesses of the single film layer respectively at the 16 first test points 10' are measured. Among the 16 single film layer thickness values, if a thickness $H_{a4'}$ at a a4' is the largest and a thickness $H_{b1'}$ is the smallest, a single film layer thickness homogeneity parameter is $(H_{a4'}-H_{b1'})/(H_{a4'}+H_{b1'})$.

Subsequently, heating of the evaporation source 6A is stopped. Another first test substrate 5' is selected and put on the evaporation device 100. Only the evaporation source 6B is heated. Similarly, another single film layer thickness homogeneity parameter is obtained. Accordingly, the distance between the supporting module 1 and the crucible platform 2 is adjusted according to whether the single film layer thickness homogeneity parameter is within a scope of the standard single film layer thickness homogeneity parameter. When the single film layer thickness homogeneity parameter corresponding to each evaporation source 6 is within the scope of the standard single film layer thickness homogeneity parameter, the distance between the supporting module 1 and the crucible platform 2 has been adjusted to the most suitable value.

Figure 4:
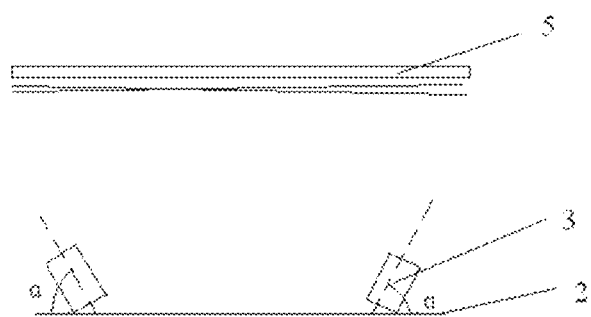
FIG. 4 schematically shows a working state of the evaporation device according to the present disclosure.
Figure 5:
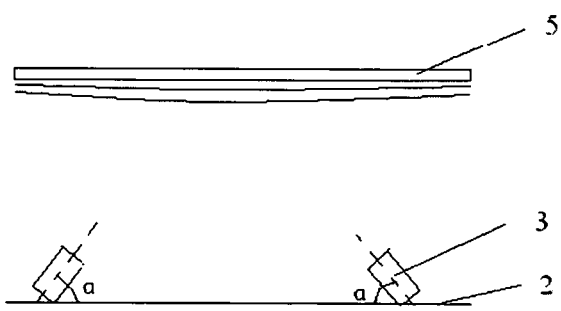
FIG. 5 schematically shows another working state of the evaporation device according to the present disclosure.
Figure 6:
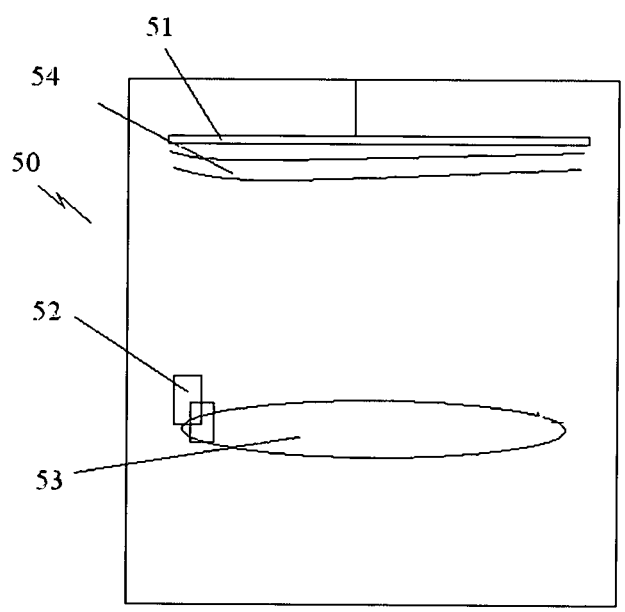
FIG. 6 schematically shows a working state of an evaporation device according to the prior art.

Specifically, in step 2, the direction of opening of each crucible 3 can be roughly determined through operating the driving module 4. In one aspect, the evaporation source 6 in each of the crucibles 3 volatilizes outwardly and obliquely in a homogeneous manner, so that a peak value of the film thickness formed respectively corresponding to each evaporation source 6 is outside the substrate 5. In this case, improvement of a mixing homogeneity of organic molecular material in each evaporation source 6 can be facilitated, as shown in FIG. 4. In another aspect, the evaporation source 6 in each of the crucibles 3 volatilizes inwardly and obliquely in a homogeneous manner, so that the peak value of the film thickness formed respectively corresponding to each evaporation source 6 is on the substrate 5. In this case, improvement of a mixing homogeneity of organic molecular material in each evaporation source 6 can also be facilitated, as shown in FIG. 5.

Preferably, an angle α formed between a straight line of volatilization of the evaporation source 6 in the crucible 3 and a plane in which the crucible platform 2 is located is in a range of 10-80 degrees. Such configuration can not only satisfy the requirement for improving the mixing homogeneity of the film thickness of the substrate, but also guarantee a deposition efficiency of the organic molecular material on the substrate 5.

A second test substrate 5" is placed into the evaporation device 100, so that the evaporation sources 6 (for example, when it is necessary to evaporate only two evaporation sources, two evaporation sources are arranged) are volatized simultaneously, so as to form a mixed film layer on the second test substrate 5". Different second test points 10" are selected on the second test substrate 5", so as to obtain a thickness value of the mixed film layer at each of the second test points 10". A ratio of a difference between a maximum value and a minimum value of the thickness value of the mixed film layer at the second test points 10" on the second test substrate 5" to an average value of the maximum value and the minimum value is calculated to obtain a test mixed film layer thickness homogeneity parameter. When the test mixed film layer thickness homogeneity parameter is smaller than a standard mixed film layer thickness homogeneity parameter, the direction of opening of each crucible 3 is fixed. Preferably, the standard mixed film layer thickness homogeneity parameter is 1%.

Similarly, 12-24 of second test points 10" are arranged on the second test substrate 5" (not shown in the drawings, for specific distribution, please refer to FIG. 3, 5" is equivalent to 5' and 10" is equivalent to 10'). Further preferably, when the second test point 10" is square shaped, the second test points 10" are evenly distributed along a diagonal line. Such configuration can guarantee not only a precision of a test method but also an efficiency of the test.

For example, in FIG. 4, if the test mixed film layer thickness homogeneity parameter is larger than the standard mixed film layer thickness homogeneity parameter, and the maximum thickness of the mixed film layer is located at a position that approximates the evaporation source 6A (one of the two evaporation sources) but is away from the evaporation source 6B (the other of the two evaporation sources), the driving module 4 is operated so that the crucible 3 at the evaporation source 6A rotates to the left, or the crucible 3 at the evaporation source 6B rotates to the left, or the crucibles 3 at both the evaporation source 6A and the evaporation source 6B rotate to the left simultaneously. After the test mixed film layer thickness homogeneity parameter is smaller than the standard mixed film layer thickness homogeneity parameter, a position of each crucible 3 is fixed, so as to get ready for official production of the substrate 5.

Although the present disclosure has been described in view of preferred embodiments, various modifications and variants to the present disclosure may be made by anyone skilled in the art, without departing from the scope and spirit of the present disclosure. The present disclosure is not limited to the specific examples disclosed herein, but rather includes all the technical solutions falling within the scope of the claims. Therefore, the scope of the present disclosure is subject to the scope of the claims.

The invention claimed is:
1. An evaporation method for an organic light-emitting diode substrate, comprising:
    step 1, regulating a distance between a supporting module for supporting a substrate and a crucible platform of an evaporation device, step 2, adjusting a direction of opening of a crucible disposed on the crucible platform, and step 3, placing a substrate to be evaporated on the supporting module, and volatizing an evaporation source in the crucible and attaching the volatized evaporation source onto a surface of the substrate;

wherein in step 1, the evaporation source is selected and volatilized, so as to form a single film layer on a corresponding first test substrate; different first test points are selected on the first test substrate, so as to obtain a thickness value of the single film layer at each of the first test points; a ratio of a difference between a maximum value and a minimum value of the thickness values of the single film layer at the first test points on the first test substrate to a sum there between is calculated to obtain a test single film layer thickness homogeneity parameter; and a comparison of the test single film layer thickness homogeneity parameter with a standard single film layer thickness homogeneity parameter is made, so as to adjust the distance between the supporting module and the crucible platform;

wherein the standard single film layer thickness homogeneity parameter is in a range of 1% to 3%, and wherein when the test single film layer thickness homogeneity parameter is smaller than 1%, the distance between the supporting module and the crucible platform is reduced and when the test single film layer thickness homogeneity parameter is larger than 3%, the distance between the supporting module and the crucible platform is increased.

2. The evaporation method according to claim 1, wherein 12-24 of the first test points are selected on the first test substrate.

3. The evaporation method according to claim 2, wherein when the first test substrate is square shaped, the first test points are evenly distributed along a diagonal line.

4. The evaporation method according to claim 1, wherein in step 2, the direction of opening of each of the crucibles is coarsely adjusted, so that the evaporation source in each of the crucibles volatilizes either outwardly and obliquely in a homogeneous manner, or inwardly and obliquely in a homogeneous manner.

5. The evaporation method according to claim 1, wherein in step 2, the direction of opening of each of the crucibles is coarsely adjusted, so that the evaporation source in each of the crucibles volatilizes either outwardly and obliquely in a homogeneous manner, or inwardly and obliquely in a homogeneous manner.

6. The evaporation method according to claim 3, wherein in step 2, the direction of opening of each of the crucibles is coarsely adjusted, so that the evaporation source in each of the crucibles volatilizes either outwardly and obliquely in a homogeneous manner, or inwardly and obliquely in a homogeneous manner.

7. The evaporation method according to claim 2, wherein in step 2, the direction of opening of each of the crucibles is coarsely adjusted, so that the evaporation source in each of the crucibles volatilizes either outwardly and obliquely in a homogeneous manner, or inwardly and obliquely in a homogeneous manner.

8. The evaporation method according to claim 3, wherein in step 2, the direction of opening of each of the crucibles is coarsely adjusted, so that the evaporation source in each of the crucibles volatilizes either outwardly and obliquely in a homogeneous manner, or inwardly and obliquely in a homogeneous manner.

9. The evaporation method according to claim 4, wherein an angle formed between a straight line of volatilization of the evaporation source in the crucible and a plane in which the crucible platform is located is in a range of 10-80 degrees.

10. The evaporation method according to claim 4, wherein in step 2, each evaporation source is volatized, so that a mixed film layer is formed on a second test substrate, and different second test points are selected on the second test substrate, so as to obtain a thickness value of the mixed film layer at each of the second test points; and wherein a ratio of a difference between a maximum value and a minimum value of the thickness values of the mixed film layer to an average value thereof is calculated to obtain a test mixed film layer thickness homogeneity parameter; and when the test mixed film layer thickness homogeneity parameter is smaller than a standard mixed film layer thickness homogeneity parameter, the direction of each of the crucibles is fixed.

11. An evaporation device for implementing an evaporation method, wherein the evaporation method includes:

step 1, regulating a distance between a supporting module for supporting a substrate and a crucible platform of an evaporation device, step 2, adjusting a direction of opening of a crucible disposed on the crucible platform, and step 3, placing a substrate to be evaporated on the supporting module and volatizing an evaporation source in the crucible and attaching the volatized evaporation source onto a surface of the substrate; and wherein the evaporation device comprises:
the supporting module for supporting the substrate,
the crucible platform disposed under the supporting module, the crucible being disposed on the crucible platform,
the evaporation source disposed in the crucible, and
a driving module for driving the crucible to rotate, the driving module comprising a driving shaft fixedly connected with the crucible and a driving source connected with the driving shaft;

wherein in step 1, the evaporation source is selected and volatized, so as to form a single film layer on a corresponding first test substrate; different first test points are selected on the first test substrate, so as to obtain a thickness value of the single film layer at each of the first test points; a ratio of a difference between a maximum value and a minimum value of the thickness values of the single film layer at the first test points on the first test substrate to a sum thereof is calculated to obtain a test single film layer thickness homogeneity parameter; and a comparison of the test single film layer thickness homogeneity parameter with a standard single film layer thickness homogeneity parameter is made, so as to adjust the distance between the supporting module and the crucible platform;

wherein the standard single film layer thickness homogeneity parameter is in a range of 1-3%, and wherein when the test single film layer thickness homogeneity parameter is smaller than 1%, the distance between the supporting module and the crucible platform is reduced, and when the test single film layer thickness homogeneity parameter is larger than 3%, the distance between the supporting module and the crucible platform is increased.

12. The evaporation device according to claim 11, wherein 12-24 of the first test points are selected on the first test substrate.

13. The evaporation device according to claim 12, wherein when the first test substrate is square, the first test points are evenly distributed along a diagonal line.

14. The evaporation device according to claim 11, wherein in step 2, the direction of opening of each of the crucibles is coarsely adjusted, so that the evaporation source in each of the crucibles volatilizes either outwardly and obliquely in a homogeneous manner, or inwardly and obliquely in a homogeneous manner.

15. The evaporation device according to claim 11, wherein a thermal insulation member is disposed between the driving shaft and the crucible.

16. The evaporation device according to claim 11, wherein a thermal insulation member is disposed between the driving shaft and the crucible.

\* \* \* \* \*